US012696517B2

(12) United States Patent
Hell et al.

(10) Patent No.: US 12,696,517 B2
(45) Date of Patent: Jul. 28, 2026

(54) SEMICONDUCTOR DEVICE AND METHOD FOR MANUFACTURING A SEMICONDUCTOR DEVICE

(71) Applicant: Infineon Technologies AG, Neubiberg (DE)

(72) Inventors: Michael Hell, Erlangen (DE); Rudolf Elpelt, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 479 days.

(21) Appl. No.: 18/139,060

(22) Filed: Apr. 25, 2023

(65) Prior Publication Data

US 2024/0096988 A1 Mar. 21, 2024

(30) Foreign Application Priority Data

May 4, 2022 (DE) .......................... 102022110998.4

(51) Int. Cl.
*H10D 64/27* (2025.01)
*H10D 30/01* (2025.01)
(Continued)

(52) U.S. Cl.
CPC ....... *H10D 64/513* (2025.01); *H10D 30/0241* (2025.01); *H10D 30/6217* (2025.01);
(Continued)

(58) Field of Classification Search
CPC ............... H10D 64/513; H10D 62/154; H10D 62/8325; H10D 62/107; H10D 62/127;
(Continued)

(56) References Cited

U.S. PATENT DOCUMENTS 4,954,854 A 9/1990 Dhong et al.
11,244,830 B2 * 2/2022 Chen ..................... H01L 21/046
(Continued)

OTHER PUBLICATIONS

Kato, T., et al., "Enhanced Performance of 50 nm Ultra-Narrow-Body Silicon Carbide MOSFETs based on FinFET effect", 32nd International Symposium on Power Semiconductor Devices and ICs (ISPSD), Vienna, Austria, 2020, pp. 62-65.
(Continued)

*Primary Examiner* — Andres Munoz
(74) *Attorney, Agent, or Firm* — Murphy, Bilak & Homiller, PLLC

(57) ABSTRACT

A semiconductor device includes a transistor. The transistor includes gate trenches formed in a semiconductor substrate, extending in a first horizontal direction and patterning the semiconductor substrate into ridges. The ridges are arranged between two adjacent gate trenches, respectively. The transistor further includes a gate electrode arranged in at least one of the gate trenches, a source region of a first conductivity type, a channel region, and a drift region of the first conductivity type. The source region, channel region and a part of the drift region are arranged in the ridges. The gate electrode is insulated from the channel region and the drift region. The channel region includes a doped portion of a second conductivity type. A doping concentration of the doped portion decreases in a second horizontal direction intersecting the first horizontal direction from a region close to the gate electrode to a central portion of the ridge.

13 Claims, 12 Drawing Sheets

(51) Int. Cl.
H10D 30/62 (2025.01)
H10D 62/13 (2025.01)
H10D 62/832 (2025.01)
H10P 30/20 (2026.01)

(52) U.S. Cl.
CPC ....... H10D 62/154 (2025.01); H10D 62/8325 (2025.01); H10P 30/2042 (2026.01); H10P 30/21 (2026.01); *H10D 30/6219* (2025.01)

(58) Field of Classification Search
CPC .... H10D 62/393; H10D 64/256; H10D 62/10; H10D 62/124; H10D 62/235; H10D 62/292; H10D 62/299; H10D 30/0241; H10D 30/6217; H10D 30/6219; H10D 30/668; H10D 12/031; H10D 30/0297; H10D 30/658; H10D 30/60; H10D 30/62; H01L 21/046; H01L 21/047; H01L 21/26586

See application file for complete search history.

(56) References Cited

U.S. PATENT DOCUMENTS

| | | | |
|---|---|---|---|
| 2003/0003637 A1* | 1/2003 | Ninomiya | H10D 30/668 |
| | | | 257/E29.066 |
| 2005/0167742 A1 | 8/2005 | Challa et al. | |
| 2005/0179082 A1* | 8/2005 | Miyata | H10D 62/393 |
| | | | 257/E29.066 |
| 2007/0221952 A1 | 9/2007 | Thorup et al. | |
| 2025/0063775 A1* | 2/2025 | Hell | H10D 62/8325 |

OTHER PUBLICATIONS

Udrea, F., et al., "The FinFET effect in Silicon Carbide MOSFETs", 33rd International Symposium on Power Semiconductor Devices and ICs (ISPSD), Nagoya, Japan, 2021, pp. 75-78.

* cited by examiner

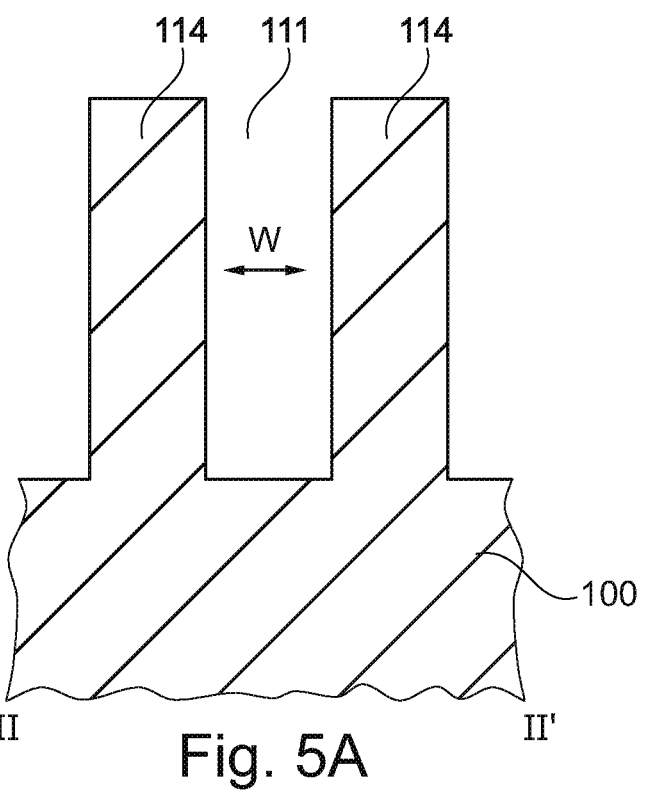
Fig. 5A
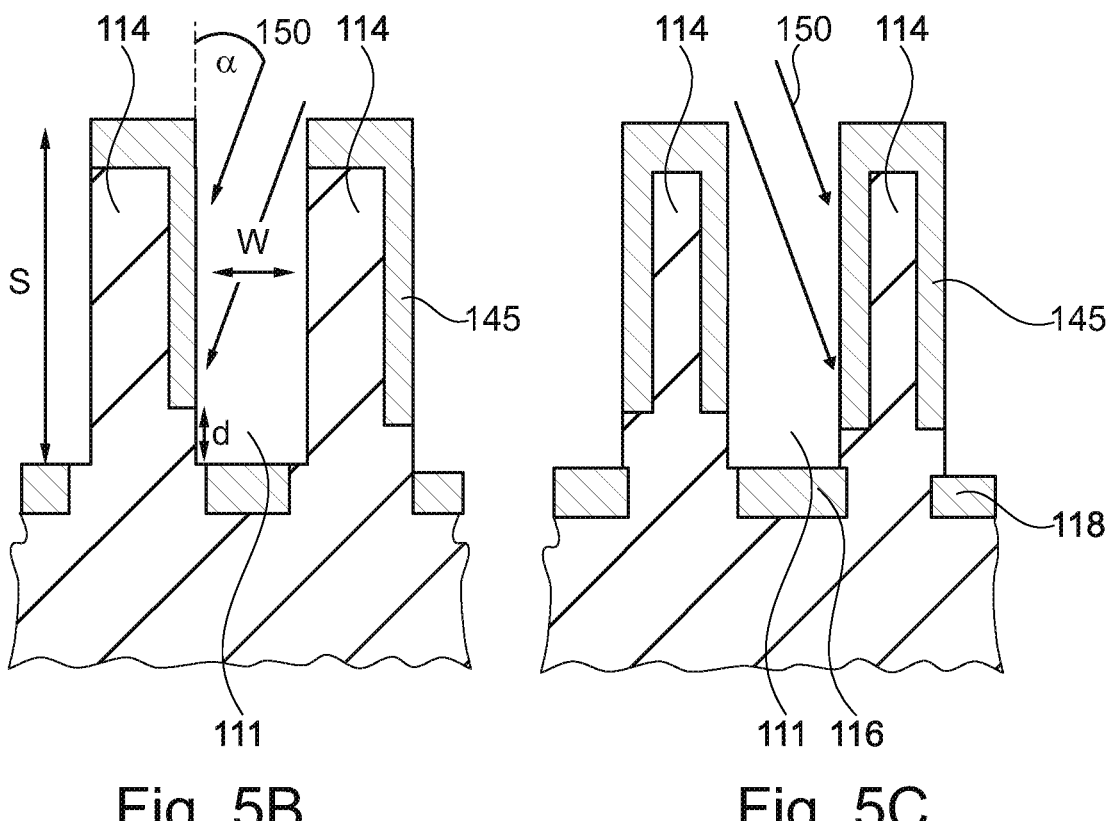
Fig. 5B          Fig. 5C

SEMICONDUCTOR DEVICE AND METHOD FOR MANUFACTURING A SEMICONDUCTOR DEVICE

TECHNICAL FIELD

Examples of the present disclosure relate to semiconductor devices, in particular, to semiconductor devices comprising a transistor, and to a method of manufacturing the semiconductor device.

BACKGROUND

Transistors, in which a gate electrode is arranged in trenches adjacent to a channel region are widely used. Attempts are being made to further improve characteristics of these transistors.

The present application is directed to a semiconductor device comprising an improved transistor which may be beneficially applied e.g. to a silicon carbide substrate.

SUMMARY

According to examples, a semiconductor device comprises a transistor, the transistor comprising a plurality of gate trenches formed in a semiconductor substrate and extending in a first horizontal direction. The gate trenches pattern the semiconductor substrate into ridges, the ridges being arranged between two adjacent gate trenches, respectively. The transistor further comprises a gate electrode arranged in at least one of the gate trenches, a source region of a first conductivity type, a channel region, and a drift region of the first conductivity type. The source region, the channel region and a part of the drift region are arranged in the ridges. The gate electrode is insulated from the channel region and the drift region. The channel region comprises a doped portion of a second conductivity type and a doping concentration of the doped portion decreases in a second horizontal direction intersecting the first horizontal direction from a region close to the gate electrode to a central portion of the ridge.

According to an example, a method of manufacturing a semiconductor device comprising a transistor comprises forming gate trenches in a semiconductor substrate. The gate trenches extend in a first horizontal direction. The gate trenches pattern the semiconductor substrate into ridges. The ridges are arranged between two adjacent gate trenches, respectively. The method further comprises forming a source region of a first conductivity type, forming a channel region, and forming a drift region of the first conductivity type. The source region, the channel region and a part of the drift region are formed in the ridges. Forming the channel region comprises doping a portion of the ridges with dopants of a second conductivity type so that a doping concentration of the doped portion decreases in a second horizontal direction intersecting the first horizontal direction from a region close to the gate electrode to a central portion of the ridge. The method further comprises forming a gate electrode in the gate trenches. The gate electrode is insulated from the channel region and the drift region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and a method of manufacturing a silicon carbide device and together with the description serve to explain principles of the embodiments. Further embodiments are described in the following detailed description and the claims.

FIGS. 5A to 5E illustrate processes of a method of manufacturing a semiconductor device according to an example.

FIGS. 6A to 6F illustrate processes of a method of manufacturing a semiconductor device according to a further example.

FIGS. 7A to 7F illustrate processes of manufacturing a semiconductor device according to still a further example.

DETAILED DESCRIPTION

Figure 1:
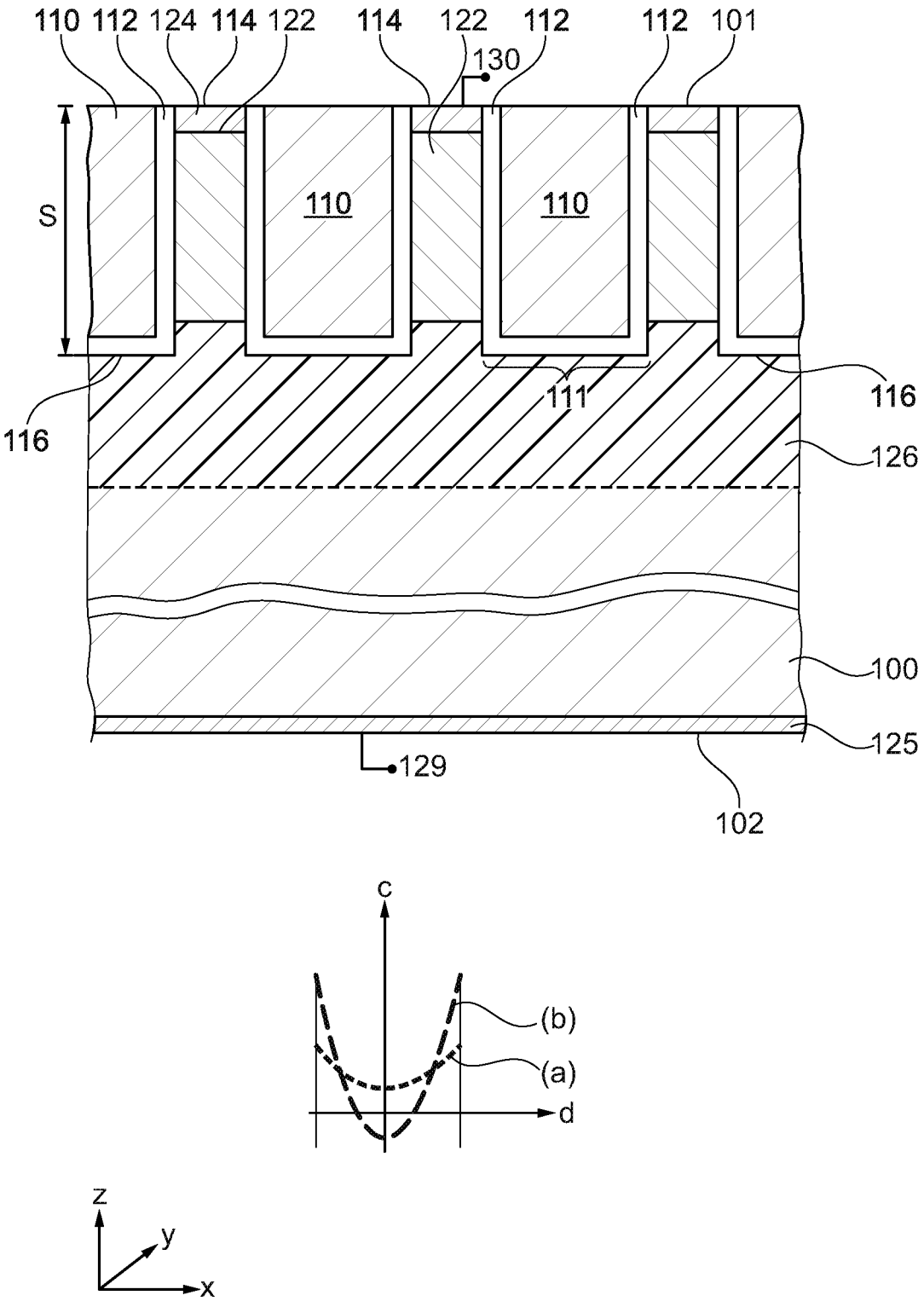
FIG. 1 shows a schematic vertical cross-section view of a semiconductor device according to an example.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as a≤y≤b. A parameter y with a value of at least c reads as c≤y and a parameter y with a value of at most d reads as y≤d.

The term "on" is not to be construed as meaning only "directly on". Rather, if one element is positioned "on" another element (e.g., a layer is "on" another layer or "on" a substrate or semiconductor body), a further component (e.g., a further layer) may be positioned between the two elements (e.g., a further layer may be positioned between a layer and a substrate if the layer is "on" said substrate).

Throughout the present specification elements of transistor cells of a field effect transistor are described. Generally, the field effect transistor may comprise a plurality of transistor cells that are connected in parallel. For example, each single transistor cell may comprise a single gate electrode, a single channel region and further components. The gate electrodes of the single transistor cells may be connected, e.g. electrically connected and/or formed of the same materials. For example, the gate electrodes of the single transistor cells may be connected to a common terminal, e.g. a gate terminal. Further components of the single transistor cells, e.g. the source regions may be respectively connected to a common source terminal. Still further components of the single transistor cells, e.g. the drift region, may be shared among at least some of the transistor cells. The present specification mainly describes the function and structure of the single transistor cells. As is to be readily understood, this description may likewise apply to the further single transistor cells. Descriptions merging the general elements of the transistor and the structural implementation by means of elements of the single transistor cells such as "a gate electrode arranged in gate trenches" are intended to mean that single gate electrodes of respective transistor cells are arranged in respective gate trenches.

An example of a semiconductor device comprises a transistor. The transistor comprises a plurality of gate trenches formed in a semiconductor substrate and extending in a first horizontal direction. The gate trenches pattern the semiconductor substrate into ridges. The ridges are arranged between two adjacent gate trenches, respectively. The transistor further comprises a gate electrode arranged in at least one of the gate trenches.

According to examples, the gate trenches and the gate electrode may be interrupted along the first horizontal direction. Moreover, the gate electrode of adjacent gate trenches may be electrically connected e.g. by means of a conductive material arranged above the gate trenches, e.g. above the ridges. For example, this may be accomplished in a central portion of the semiconductor device. According to further examples, the gate electrode of adjacent gate trenches may be electrically connected in an edge portion or at any other suitable position of the semiconductor device.

The semiconductor device may further comprise a source region of a first conductivity type, a channel region, and a drift region of the first conductivity type. The source region, the channel region and a part of the drift region are arranged in the ridges.

A current path from the source region to the drift region may extend in a depth direction of the semiconductor substrate. For example, the depth direction may correspond to a vertical direction e.g. the z-direction. According to further embodiments, the depth direction may be a direction different from the vertical direction. Generally, the depth direction is a direction different from a lateral or horizontal direction. For example, the depth direction may have a component which is perpendicular to the lateral direction. For example, the depth direction may be slanted with respect to the vertical direction.

According to further examples, the current path may have a component in a horizontal direction. For example, the source region may be arranged at a first main surface of the semiconductor substrate. The semiconductor device may further comprise a drain region that may be arranged at or adjacent to a second main surface of the semiconductor substrate. The second main surface may be different from the first main surface. By way of example, the current path from the source region to the drain region region may have a horizontal component. For example, the current path from the source region to the drift region may have a horizontal component. The current path from the source region to the drain region may further have a vertical component.

According to a further example, the source region may be arranged at a first main surface of the semiconductor substrate. The semiconductor device may further comprise a drain region at the first main surface of the semiconductor substrate. According to this example, a current path from the source region to the drift region extends in a horizontal direction. Further, a current path from the source region to the drain region may extend in a horizontal direction. For example, the current path may exclusively extend in a horizontal direction without a vertical component.

The term "ridge" as employed within this disclosure is intended to mean a structure having two sidewalls and a top portion between the sidewalls. The sidewalls extend in a depth direction. For example, the sidewalls may be slanted with respect to a vertical direction. According to further interpretations, the term "ridge" may also be understood to implement a "fin". Since the channel of the transistor is arranged within the ridge, the transistor is also referred to as a "FinFET".

Transistors described herein may specifically include IGFETs ("insulated gate field effect transistor"). IGFETs are voltage controlled devices including MOSFETs ("metal oxide semiconductor FETs") and other FETs comprising gate electrodes based on doped semiconductor material and/or comprising gate dielectrics that may or may not be exclusively based on an oxide. As is to be clearly understood, further transistors may relate to IGBTs ("insulated gate bipolar transistor").

The gate electrode may be insulated from the channel region and the drift region. For example, the gate electrode may be insulated from the channel region and the drift region by means of a gate dielectric such as e.g. silicon oxide, silicon nitride or a combination of these materials. According to further examples, any other dielectric material, e.g. a high-k dielectric may be used.

The channel region may comprise a doped portion of a second conductivity type. A doping concentration of the doped portion decreases in a second horizontal direction intersecting the first horizontal direction from a region close to the gate electrode to a central portion of the ridge. The term "central portion of the ridge" refers to the central portion measured along the second horizontal direction.

As a result, a doping profile within the ridge may be different from a constant doping profile. In more detail, the concentration of dopants of the second conductivity type has its maximum at an interface between the ridge and e.g. the gate dielectric. Further, the doping concentration of the dopants of the second conductivity type has its minimum in a central portion of the ridge.

According to an example, the channel region may further comprise a doped portion of the first conductivity type in the central portion of the ridge. In this case, the center of the ridge may have a negative p doping which corresponds to a doping of the first conductivity type.

For example, the doping profile may be chosen so that the channel region has a net doping of the second conductivity type. In more detail, $$N_{body} = \int_{-W/2}^{+W/2} N_{body}(x) dx > 0$$

The central portion of the ridge has a lower doping concentration of the second conductivity type, e.g. p-type, than the edge portion. Hence, referring to p-type as the second conductivity type, the conduction band has a lower energy in the center than at the interface. As a result, when e.g. a positive gate voltage is applied, it is harder to attract electrons to the interface than in the center of the ridge. This leads to an increased electron density in the center of the ridge and consequently to a larger conductivity.

Since the ridge is lightly doped with the second conductivity type in the central portion of the ridge, the lower doping level leads to a larger electron mobility in comparison to a uniformly doped channel region. This enhances the conductivity even further.

When the channel region further comprises a doped portion of the first conductivity type in the central portion of the ridge, it is possible to reach an enhancement of the effective mobility for even larger widths of the ridges. As a result, the characteristics of the transistor may be further improved. In more detail, the transistor may remain normally off when the width is not too large, e.g. smaller than 200 nm. At the same time, a large conductivity is provided in the on-state. For example, the short-circuit robustness may be enhanced by an adjusted design of the dopings of the first and second conductivity type and an appropriate channel length.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor also could be silicon-germanium, germanium, or gallium arsenide.

According to further examples, the semiconductor substrate may be a silicon carbide (SiC) substrate. According to an example, the silicon carbide substrate may have a hexagonal crystal lattice with a c-plane and further main planes. The further main planes may include a-planes or m-planes.

The material of the silicon carbide substrate may be crystalline silicon carbide of any hexagonal polytype, e.g., 2H—SiC, 4H—SiC or 6H—SiC, by way of example. In addition to the main constituents silicon and carbon, the silicon carbide body may include dopants, for example nitrogen N, phosphorus P, beryllium Be, boron B, aluminum Al, and/or gallium Ga. The silicon carbide substrate may include further impurities, for example hydrogen, fluorine and/or oxygen. The silicon carbide substrate may include or consist of a silicon carbide layer grown by epitaxy.

The silicon carbide substrate may have two essentially parallel main surfaces of the same shape and size and a lateral surface area connecting the edges of the two main surfaces. For example, the silicon carbide substrate may have the shape of a polygonal (e.g., rectangular or hexagonal) prism with or without rounded edges, a right cylinder or a slightly oblique cylinder, wherein some of the sides may lean at an angle of at most 8°, at most 5° or at most 3°.

A first main surface at a front side of the silicon carbide substrate may be planar or ribbed. A mean surface plane of the first main surface extends along the horizontal directions. The mean surface plane of a planar first main surface is identical with the planar first main surface. The mean surface plane of a ribbed first main surface is defined by the planar least squares plane of the ribbed first main surface. Position and orientation of the planar least squares plane are defined such that the sum of the squares of the deviations of surface points of the ribbed first main surface from the planar least squares plane has a minimum.

The silicon carbide substrate may horizontally extend along a plane spanned by the horizontal directions. Accordingly, the silicon carbide body may have a surface extension along two horizontal directions and may have a thickness along a vertical direction perpendicular to the horizontal directions. In other words, the vertical direction is parallel to a surface normal onto the mean surface plane.

The terms "first horizontal direction" and "second horizontal direction" define intersecting horizontal directions. Although some of the figures show—by way of illustration—the x-direction and the y-direction as examples of the first and the second horizontal directions, it is clearly to be understood, that the first horizontal direction and the second horizontal direction do not need to be perpendicular to each other. The term "depth direction" defines a direction having a component perpendicular to the mean surface plane. The term "depth direction" encompasses the vertical direction and any other direction different from a horizontal direction.

The c-plane is a {0001} lattice plane. The further main planes may include a-planes ({11-20} family of lattice planes) and m-planes ({1-100} family of lattice planes). The a-planes include the six differently oriented lattice planes (11-20), (1-210), (−2110), (−1-120), (−12-10), and (2-1-10). The m-planes include the six differently oriented lattice planes (1-100), (10-10), (01-10), (−1100), (−1010), and (0-110).

The mean surface plane of the silicon carbide substrate may be tilted to the c-plane by an off-axis angle. In other words, the c-axis may be tilted to the vertical direction by the off-axis angle. The off-axis angle may be in a range from 2 degrees to 8 degrees, for example in a range from 3 degrees to 5 degrees. In particular, the off-axis angle may be approximately 4 degrees. For example, the c-axis may be tilted such that a plane spanned by the vertical direction and the c-axis is parallel to the <11-20> direction. According to another example, the c-axis may be tilted such that a plane spanned by the vertical direction and the c-axis is parallel to the <1-100> direction. At the back side of the silicon carbide substrate, a second main surface of the silicon carbide substrate may extend parallel or approximately parallel to the mean surface plane at the front side.

The silicon carbide substrate may include a columnar portion with column sidewalls. The number of the column sidewalls may be four, five or six, by way of example. In some examples, the shape of the columnar portion may be or may approximate a prism or a pyramid (e.g., a right prism, an oblique prism, a truncated pyramid, a truncated prism; or a combination of such shapes, e.g. a combination of a right prism and a truncated pyramid or a combination of two truncated pyramids), for example with a polygonal base area, typically in the shape of a regular polygon, with four, five or six sides. However, other shapes of the base area may be possible, for example a non-regular polygon (e.g., a trapezoid-like shape or a non-regular triangle) or even an elliptical (e.g. a circular) shape. Neighboring column sidewalls (if applicable) may be connected via joining edges.

The joining edges may run parallel to each other. Alternatively, at least one of the joining edges may have another tilt angle to the vertical direction than at least one other joining edge. For example, a first joining edge may be tilted to the vertical direction by a first vertical tilt angle. A second joining edge may be tilted to the vertical direction by a second vertical tilt angle. A maximum angular difference between the first vertical tilt angle and the second vertical tilt angle may be equal to or smaller than the off-axis angle. At least one (e.g., at least two or at least three) of the column sidewalls may be oriented along a respective one of the further main planes. In other words, at least one (e.g., at least two or at least three) of the column sidewalls may be completely formed in further main planes of the crystal lattice or in planes only slightly horizontally and/or slightly vertically tilted to further main planes of the crystal lattice. The term "slightly tilted" includes angular deviations from a respective main plane in the range of less than 5 degrees in any spatial direction.

For example, at least one (e.g., one, two, three, four, five or six) column sidewall is oriented in or along a plane of the {11-20} family of lattice planes, wherein, if more than one sidewall is oriented in or along a plane of the {11-20} family of lattice planes, each column sidewall is oriented in or along a different one of the planes of the {11-20} family of lattice planes. According to another example, at least one (e.g., one, two, three, four, five or six) column sidewall is oriented in or along a plane of the {1-100} family of lattice planes, wherein, if more than one sidewall is oriented in or along a plane of the {1-100} family of lattice planes, each column sidewall is oriented in or along a different one of the planes of the {1-100} family of lattice planes. According to yet another example, one or more of the column sidewalls may be oriented to a plane of the {11-20} family of lattice planes and at least one further column sidewall may be oriented in or along one of the planes of the {1-100} family of lattice planes.

The gate trenches may pattern the first portion of the silicon carbide substrate into ridges. By way of example, at least one of the sidewalls of the gate trenches and the ridges may be parallel to the (1-100) or the (−1100) planes.

The width of the ridge measured in the second direction may be arbitrary. According to an example, the width of the ridge may be larger than 50 nm.

For example, the width of each of the ridges may be less than 2×L wherein L denotes a length of a depletion zone at an interface between the channel region and an adjacent gate dielectric. For example, the width of the depletion zone may be determined as:

$$l_d = \sqrt{\frac{4\varepsilon_s kT \ln(N_A/n_i)}{q^2 N_A}}$$

wherein $\varepsilon_S$ denotes the permittivity of the semiconductor material ($9.66*\varepsilon_0$ to $10.0*\varepsilon_0$ for silicon carbide, depending on the crystal structure), k denotes the Boltzmann constant ($1.38066*10^{-23}$ J/K), T denotes the temperature, ln denotes the natural logarithm, NA denotes the impurity concentration of the semiconductor body, $n_i$ denotes the intrinsic carrier concentration (e.g. $6.7*10^{-11}$ cm$^{-3}$ for silicon carbide at 27° C., strongly depending on the crystal structure), q denotes the elementary charge ($\sim1.6*10^{-19}$ C).

Generally, it is assumed that in a transistor the length of the depletion zone at a gate voltage corresponding to the threshold voltage corresponds to the maximum width of the depletion zone.

According to an example, each of the ridges comprise first portions and second portions that are alternatingly arranged along the first horizontal direction. The channel region is arranged in the first portion, and a body contact portion for electrically contacting the channel region may be arranged in the second portion. A source conductive layer may be electrically connected to the body contact portion.

The body contact portion may suppress or deteriorate a parasitic bipolar transistor that could otherwise be formed in the channel region.

For example, a doping concentration in at least one of the second portions of the ridges may be larger than the doping concentration in at least one of the first portions of the ridges. As a result, the channel region may be connected to the source conductive layer at a lower resistance.

According to a further example, a doping profile along the second horizontal direction in at least one of the first portions of the ridges may be identical with the doping profile along the second horizontal direction in at least one of the second portions of the ridges. For example, the channel region may be connected to the source conductive layer by means of a contact region in a bottom portion of the gate trench.

According to an example, the semiconductor device may further comprise shielding portions of the second conductivity type that are arranged below the gate trenches.

The shielding portion may contribute to shielding a gate dielectric against an electric potential that may be applied at the back side of the silicon carbide body. In a blocking mode of the silicon carbide device, the shielding portion may reduce the electric field in the gate dielectric and may thus contribute to increasing device reliability.

For example, the shielding portions may be electrically connected to a neighboring doped portion of the second conductivity type of the channel region.

For example, the gate electrode may extend along the ridges. The channel region may be in electrical contact with a source conductive layer by means of a contact region that extends between portions of the gate electrode which are assigned to neighboring ridges, respectively. In this case, the entire length of the channel region may contribute to the active channel region.

By way of example, a method of manufacturing a semiconductor device comprising a transistor comprises forming gate trenches in a semiconductor substrate. The gate trenches extend in a first horizontal direction. The gate trenches pattern the semiconductor substrate into ridges, the ridges being arranged between two adjacent gate trenches, respectively. The method further comprises forming a source region of a first conductivity type, forming a channel region, and forming a drift region of the first conductivity type. The source region, the channel region and a part of the drift region are formed in the ridges. A current path from the source region to the drift region may extend in a depth direction of the semiconductor substrate. Forming the channel region may comprise doping a portion of the ridges with dopants of a second conductivity type so that a doping concentration of the doped portion decreases in a second horizontal direction intersecting the first horizontal direction from a region close to the gate electrode to a central portion of the ridge. The method further comprises forming a gate electrode in the gate trenches.

For example, doping a portion of the ridges with dopants of the second conductivity type so that a doping concentration of the doped portion decreases in a second horizontal direction from a region close to the gate electrode to a central portion of the ridge may comprise an ion implantation process. For example, an implantation energy of the ion implantation process may be set so that the doping concentration decreases from the edge of the ridge.

By way of example, the doping process may comprise a tilted ion implantation process using dopants of the second conductivity type.

According to further examples, an implantation angle may be selected in dependence from a width of the gate trenches and a depth of the gate trenches so that a lower portion of the ridges is implanted with a decreased dose. In this manner, a doping profile may be arbitrarily set.

According to an example, forming the channel region comprises a further ion implantation process using dopants of the first conductivity type. Using this further ion implantation process, the central portion of the ridges may be doped with the first conductivity type.

For example, the ion implantation process using dopants of the first conductivity type may comprise a further tilted ion implantation process. During this process an implantation angle different from implantation angle of the tilted ion implantation process using dopants of the second conductivity type may be employed.

For example, the ion implantation process using dopants of the first conductivity type may comprise a first implantation sub-process and a second implantation sub-process. The first implantation sub-process may be performed before forming the gate trenches and the second implantation sub-process may be performed after forming the gate trenches. For example, the source regions may be defined by the first implantation sub-process. The second implantation sub-process may be a tilted ion implantation process.

FIG. 1 shows a vertical cross-section view of a semiconductor device according to an example. The cross-sectional view of FIG. 1 is taken along the second horizontal direction intersecting the ridges and the gate trenches.

Gate trenches 111 are formed in a first main surface 101 of a semiconductor substrate 100. The gate trenches 111 may have an identical width and an identical distance from each other. The gate trenches 111 pattern the semiconductor substrate 100 into ridges 114 so that one ridge 114 is arranged between two adjacent gate trenches 111. A gate electrode 110 may be arranged in at least one of the gate trenches 111. The gate electrode 110 may be insulated from adjacent semiconductor material by means of a gate dielectric 112. The semiconductor device comprises a source region 124 which may be arranged in an upper portion of the ridges 114. For example, the source region 124 may be arranged adjacent to a first main surface 101 of the ridge. The source region 124 is doped with dopants of the first conductivity type. The semiconductor device further comprises a channel region 122 which is arranged in the ridges 114.

The semiconductor device further comprises a drift region 126 of the first conductivity type. The channel region 122 is arranged between the source region 124 and the drift region 126 along a depth direction. A drain region 125 may be arranged adjacent to a second main surface 102 of the semiconductor substrate 100. For example, the drain region 125 may be electrically connected to a drain terminal 129. The drain region 125 may be doped with dopants of the first conductivity type.

The lower portion of FIG. 1 illustrates a doping concentration of dopants of the channel region 122. The doping concentration C is illustrated in dependence from a distance d from a central portion of the ridge 114. As is e.g. illustrated by graphs (a) and (b), the doping concentration may increase from the central portion to the respective edge region of the ridge 114. As is specifically illustrated by graph (b), the doping concentration may be negative in the central portion of the ridge 114. In other words, in this case, the net doping concentration is of the first conductivity type in the central portion. The doping concentration of the second conductivity type increases towards an edge region of the ridge 114. The ridges 114 may have a height s which is measured from an upper main surface 101 of the ridge to the bottom side 116 of the gate trenches 111.

FIGS. 2A to 2E illustrate further details of an example of the semiconductor device in order to illustrate the respective contact portions.

Figure 2A:
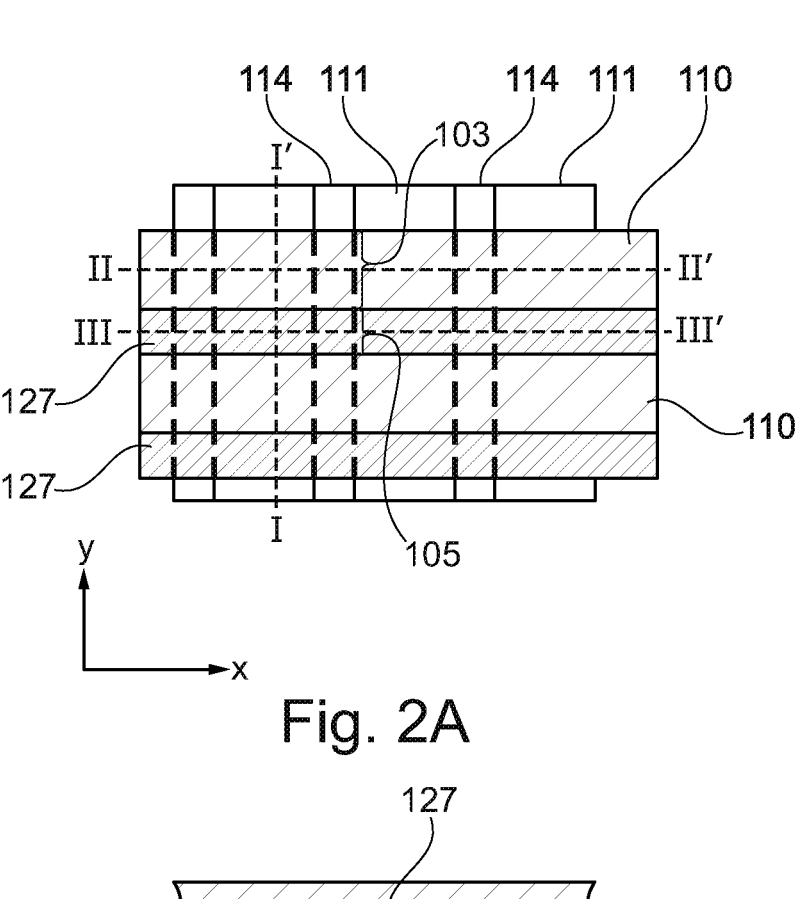
FIG. 2A shows a horizontal cross-sectional view of a portion of a semiconductor device according to an example.

FIG. 2A shows a horizontal cross-sectional view of an example of the semiconductor device for illustrating a layout. As is shown, the gate trenches 111 and the ridges 114 may extend in a first horizontal direction, e.g. the y-direction. Further, stripes of a source conductive layer 127 and the gate electrode 110 may extend in a second horizontal direction, e.g. the x-direction.

Figure 2B:
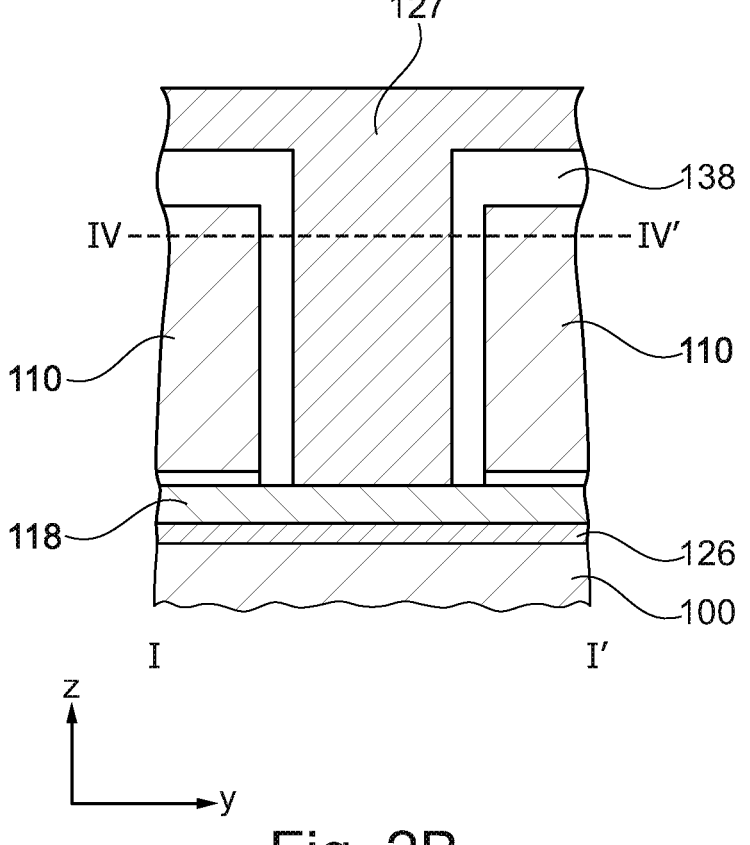
FIG. 2B shows a vertical cross-sectional view of a portion of a semiconductor device according to an example.

FIG. 2B shows a vertical cross-sectional view which is taken between I and I' as is also illustrated in FIG. 2A. In more detail, the cross-sectional view of FIG. 2B is taken along the first direction along a gate trench 111.

FIG. 2B shows a semiconductor substrate 100 including a portion of the first conductivity type forming the drift region 126. A shielding portion 118 is arranged over the drift region 126. The gate electrodes 110 are formed as stripes extending perpendicularly to the plane of the drawing, e.g. in the second horizontal direction. The source conductive layer 127 is arranged between adjacent stripes of the gate electrodes 110. Stripes of the source conductive layer 127 extend in the second horizontal direction. Further, a portion of the source conductive layer 127 may be arranged over the gate electrode 110. The source conductive layer 127 may be insulated from the gate electrode 110 by means of an interlayer dielectric 138.

Shielding portions 118 which are doped with a second conductivity type, are arranged below the gate trenches 111.

Figures 2C, 2D, 2E:
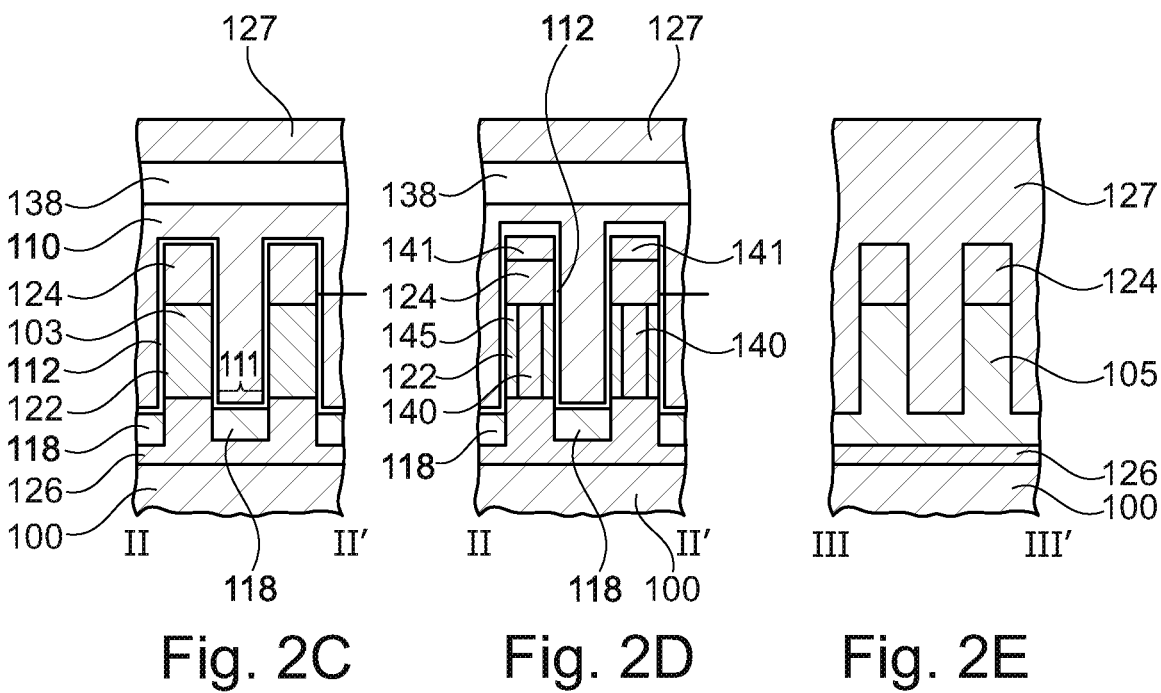
FIGS. 2C to 2E show cross-sectional views of further portions of the semiconductor device according to an example.

FIG. 2C shows a cross-sectional view which is taken between II and II', as is also illustrated in FIG. 2A. In more detail, the cross-sectional view of FIG. 2C is taken along the second direction in a region of the gate electrode 110. The cross-sectional view of FIG. 2C is taken at a similar position as the cross-sectional view of FIG. 1 and shows a first portion 103 of the ridge 114. As is shown, the source region 124 is arranged in an upper portion of the respective ridges 114. The channel region 122 comprises a doped portion of the second conductivity type, wherein the doping profile may be as illustrated in the lower portion of FIG. 1. A drift region 126 may be arranged in a lower portion of the ridges 114. The gate electrode 110 is arranged in the gate trenches 111 so as to be adjacent to three sides of the ridges 114. The gate electrode 110 is insulated from the ridge 114 by means of a gate dielectric 112. As is illustrated, the gate electrode 110 is formed in the gate trenches 111 and also over the ridges 114. The source conductive layer 127 is arranged over the gate electrode 110. The source conductive layer 127 is insulated from the gate electrode 110 by means of an interlayer dielectric.

FIG. 2D shows a cross-sectional view of a further example which is taken also between II and II' in a similar manner as FIG. 2C. The structure shown in FIG. 2D is identical with the structure shown in FIG. 2C except for a metal layer 141 which is formed over the source regions 124. Due to the presence of the portions of the metal layer 141, conduction losses in the source region 124 may be reduced. Further, differing from the example illustrated in FIG. 2C, in FIG. 2D, a doped portion 140 of the first conductivity type may be arranged in the central portion of the ridge. Further, a doped portion 145 of the second conductivity type is arranged at an edge portion of the ridge. The doping concentration of dopants of the second conductivity type decreases from the interface to the gate dielectric 112 towards the central portion of the ridge 114. Further, according to the example of FIG. 2D, the doped portion 145 at the edge portion is insulated from the shielding portion 118.

FIG. 2E shows a cross-sectional view of a second portion 105 of the ridge 114. The cross-sectional view of FIG. 2E extends in the second direction. In more detail, the cross-sectional view of FIG. 2E is taken between III and III' as also illustrated in FIG. 2A. Accordingly, the cross-sectional view is taken in a portion in which no gate electrode 110 is adjacent to the ridge 114. As is shown, the source region 124 is arranged in an upper portion of the ridge. The lower portion is doped with dopants of the second conductivity type. The lower portion is electrically connected to the source conductive layer 127 and, thus, implements a body contact portion 121. The contact between the lower portion and the source conductive layer 127 is accomplished via the sidewalls of the ridge and the bottom portion of the gate trench 111. A doping concentration of the lower portion of the second portion 105 of the ridge may be larger than that of the first portion 103. As a result, a resistance of a contact between the channel region and the source conductive layer 127 may be reduced. The doped portion of the second conductivity type in the second portion 105 in the ridge is electrically connected with the shielding portions below the gate trenches, as can also be taken from FIG. 2B.

As has been described with reference to FIGS. 2A to 2E, according to an example, by wrapping the ridges 114 with the source conductive layer 127, a large contacting area may be created. As a result, a contact resistance may be reduced.

Figure 3A:
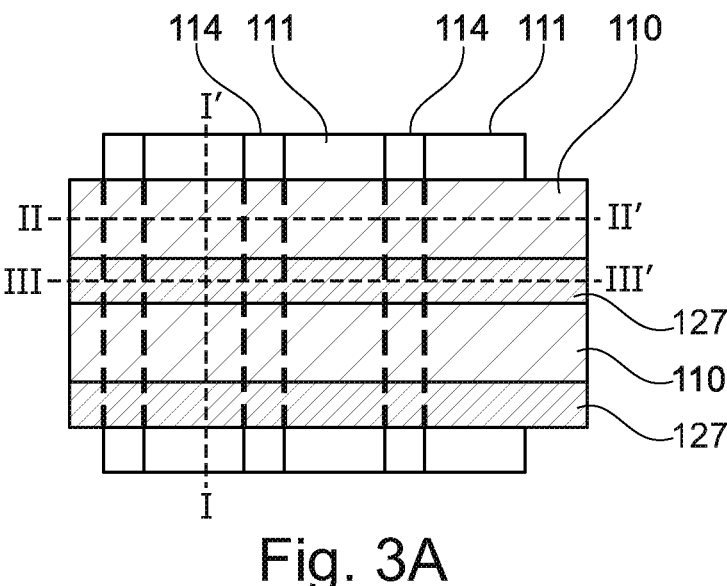
FIG. 3A shows a horizontal cross-sectional view of a portion of a semiconductor device according to an example.

FIG. 3A shows a further horizontal cross-sectional view for illustrating a layout of a semiconductor device according to a further example. The layout is similar to the layout of FIG. 2A.

Figure 3B:
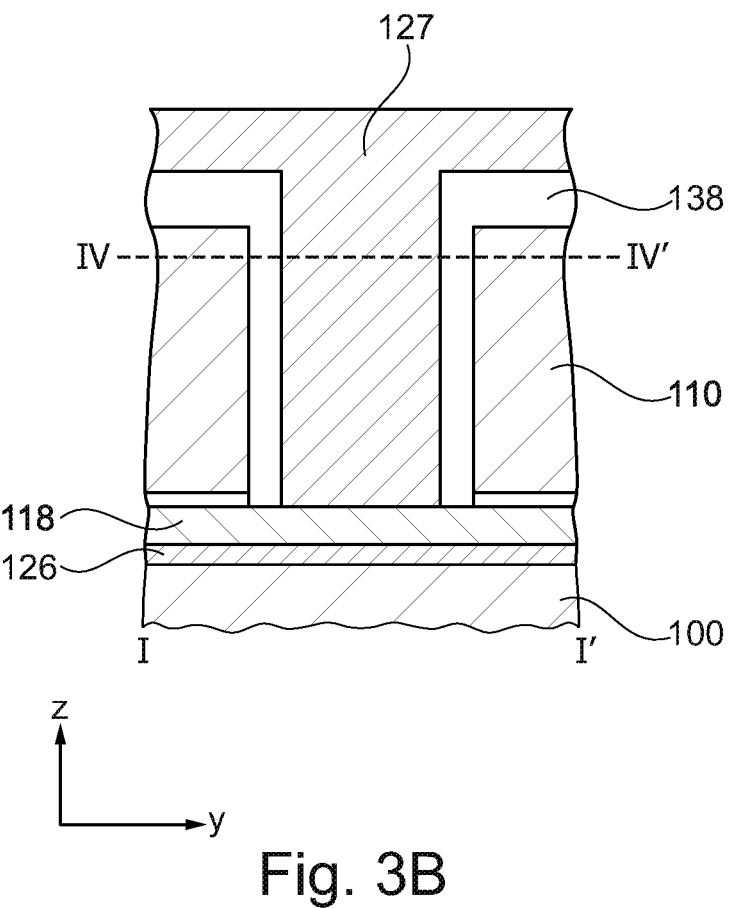
FIGS. 3B to 3D show vertical cross-sectional views of portions of the semiconductor device according to an example.
Figure 3C:
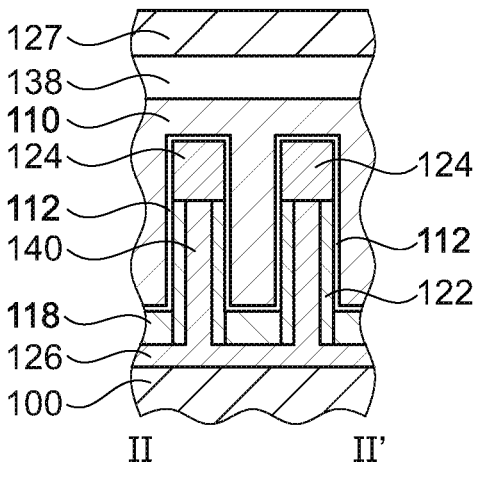
Figure 3D:
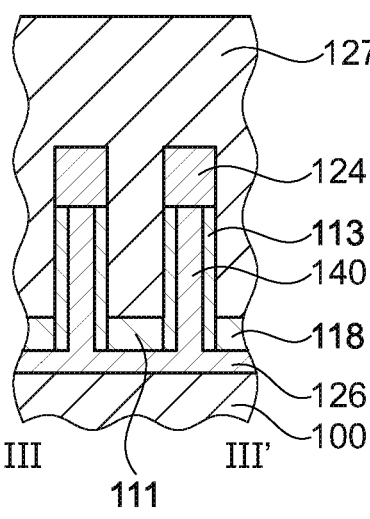

The horizontal cross-sectional view of FIG. 3A may be taken between IV and IV', as is also illustrated in FIG. 3D.

FIG. 3B shows a cross-sectional view between I and I', as is also shown in FIG. 3A. The components illustrated in FIG. 3B are similar to the components shown in FIG. 2B so that a discussion thereof is omitted.

FIG. 3C shows a cross-sectional view between II and II', as is also shown in FIG. 3A.

In the example of FIG. 3C, a doped portion of the first conductivity type 140 is arranged in a central portion of the ridge, and a doped portion 145 of the second conductivity type is arranged in the edge portion of the ridge. Further, a concentration of the dopants of the second conductivity type decreases from an interface to the gate dielectric 112 to a central portion of the ridge. The further component shown in FIG. 3C are similar to those illustrated in FIG. 2C. However, differing from the view shown in FIG. 2C, the doped portion 145 of the second conductivity type arranged at the edge portion of the ridge extends to the shielding portion 118 and is electrically connected with the shielding portion 118.

FIG. 3D shows a cross-sectional view which is taken between III and III' in FIG. 3A. As is illustrated, the first and the second portions of the ridges may be identical to each other. For example, as illustrated, a doped portion 140 of the first conductivity type may be arranged in a central portion of the ridge 114. According to further examples, no doped portion 140 is present in the central portion of the ridge 114. Further, the channel region 122 is electrically connected with the shielding regions 118.

FIGS. 4A to 4F illustrate cross-sectional views of a further example of a semiconductor device.

Figure 4A:
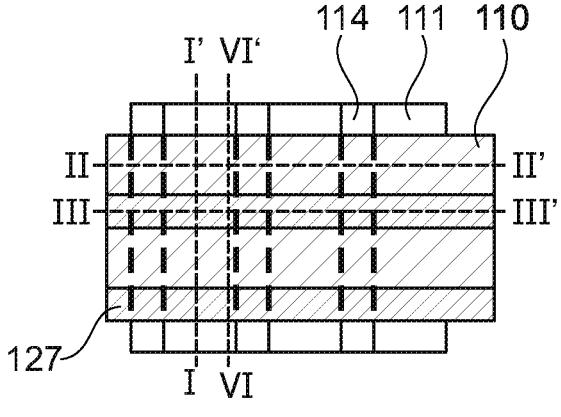
FIGS. 4A and 4B show horizontal cross-sectional views of a semiconductor device taken at different vertical positions of the device according to an example.

FIG. 4A shows a horizontal cross-sectional view of the semiconductor device at a vertical position. The cross-sectional view of FIG. 4A is taken between IV and IV' as is also illustrated in FIG. 4F.

At the first vertical position, stripes of gate electrodes 110 and stripes of a source conductive layer 127 extend in the second direction. The stripes of the gate electrode 110 and the stripes of the source conductive material 127 are alternatingly arranged along the first direction.

Figure 4B:
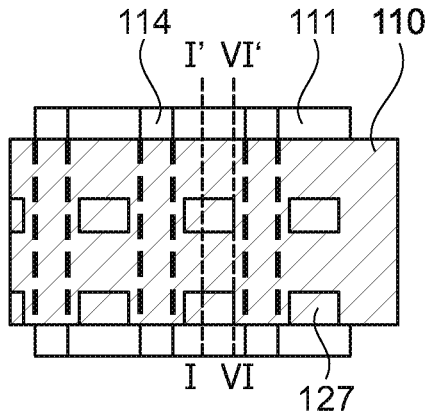
Figure 4C:
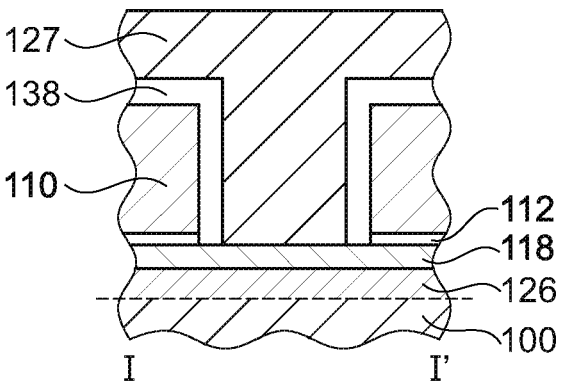
FIGS. 4C to 4F show vertical cross-sectional views of the semiconductor device, taken at different locations and along different directions, respectively.
Figure 4D:
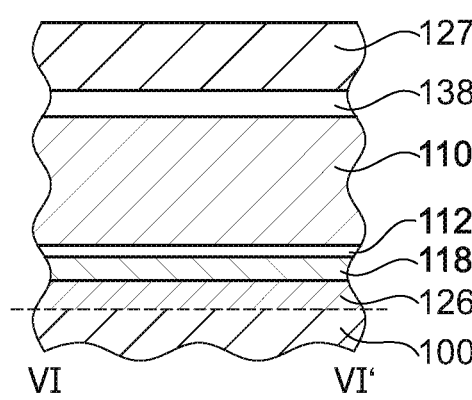
Figure 4E:
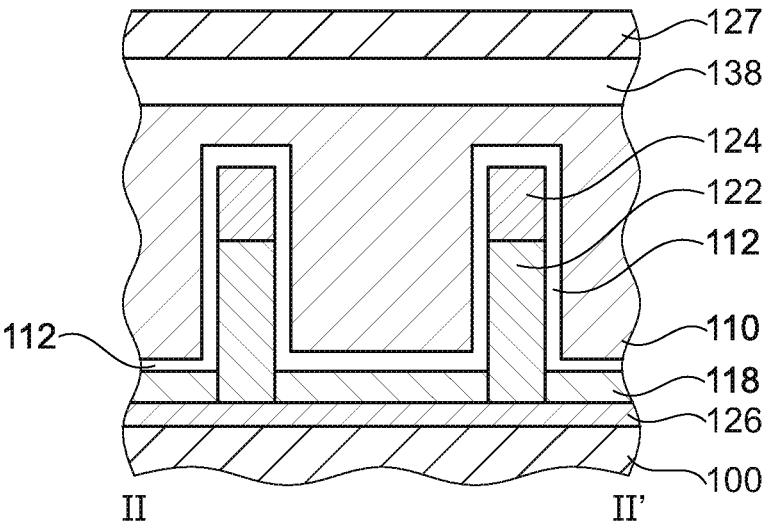
Figure 4F:
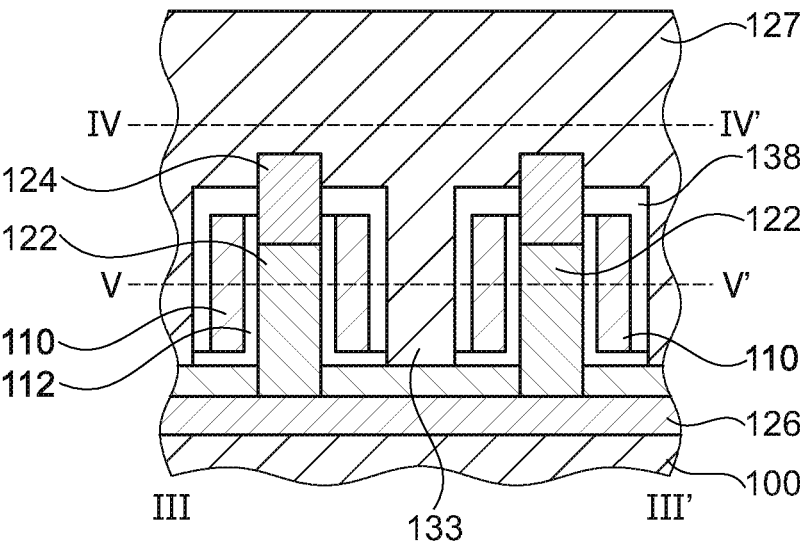

FIG. 4B shows a cross-sectional that is taken at a second vertical position, between V and V', as is also illustrated in FIG. 4F. The cross-sectional view of FIG. 4B is taken so as to intersect the ridges. As is illustrated in FIG. 4B, at the second vertical position, the source conductive layer 127 is not arranged in stripes but in isolated islands embedded in the material of the gate electrode 110.

FIG. 4C shows a vertical cross-sectional view that is taken between I and I', as is illustrated in FIG. 4A. The cross-sectional view of FIG. 4C corresponds to the cross-sectional view of FIGS. 3B and 2B, and a description thereof is omitted here.

FIG. 4D shows a vertical cross-sectional view that is taken between VI and VI'. The cross-sectional view of FIG. 4D is taken between the islands of the source conductive layer 127 and the ridges, as is also illustrated in FIG. 4B. As is shown, the gate electrode 110 extends along the first direction.

FIG. 4E shows a cross-sectional view of the semiconductor device that is taken between II and II' as is illustrated in FIG. 4A. The cross-sectional view of FIG. 4E corresponds to the cross-sectional view of FIG. 3C and the description thereof is omitted here.

FIG. 4F shows a vertical cross-sectional view of the semiconductor device between III and III' as is also illustrated in FIG. 4A. As can be recognized from a comparison of the cross-sectional view of FIG. 4F with the cross-sectional view of FIG. 3D, the gate electrode 110 is arranged adjacent to the ridge even in portions of the ridge arranged between adjacent stripes of the gate electrode 110 illustrated in FIG. 4A. Accordingly, the entire length of the ridge contributes to the active channel region. This concept may be employed for larger trench widths. A body contact portion for electrically connecting the channel region 122 to the source conductive material 127 may be accomplished via a contact region 133 that is arranged between adjacent ridges 114 and a doped portion of the second conductivity type.

In the following, various methods for manufacturing the semiconductor device will be described. FIG. 5A shows a portion of the semiconductor substrate 100 that may be lightly doped with dopants of the first conductivity type. Gate trenches 110 have been formed in the first main surface 101 of the semiconductor substrate. The gate trenches 111 pattern the semiconductor substrate 100 into ridges 114 so that a ridge 114 is arranged between two adjacent gate trenches 111. The cross-sectional view of FIG. 5A is taken between II and II', as is, e.g. illustrated in FIG. 2A.

Thereafter, a first doping process 150 with dopants of the second conductivity type is performed. The doping process 150 may be performed as a tilted ion implantation step, wherein the dopants of the second conductivity type are implanted at an implantation angle α which is measured as the smaller angle between a sidewall of the ridge and the implantation direction. The ridges have a distance w and a height s. The height s corresponds to a depth of the gate trenches 111. As is illustrated in FIG. 5B, the tilted ion implantation process 150 is performed from the right side, so that the right side of each of the ridges 114 is doped to form a doped portion 145. When using a comparatively low implantation energy, the doping concentration decays away from the surface of the ridge.

The implantation angle α may be selected so that a shadowing of adjacent ridges occurs. For example, the implantation angle α may fulfill the following formula:

$$\alpha \sim \arctan(w/s) \qquad \text{i.}$$

wherein w denotes a distance between adjacent ridges 114 and s denotes the height of the ridge 114.

As is illustrated in FIG. 5B, due to the shadowing a lower interface of the doped portion 145 has a distance d to a bottom portion of the gate trench 111. In this region, the doping concentration of the doped portion 145 is reduced with respect to the upper portion. Due to this specific doping profile, a pinch-off of the channel region may be avoided.

Further, a vertical implantation process with dopants of the second conductivity type may be performed in order to dope the portions below the bottom side 116 of the gate trench 111.

Further, as is illustrated in FIG. 5C, a further first implantation process 150 with dopants of the second conductivity type may be performed from the left side so that the left sidewall of the ridges 114 is doped. The angle of this further first implantation process 150 may be set in the same manner as the first implantation process 150 from the right side.

Figures 5D, 5E, 6A, 6B, 6C, 6D, 6E:
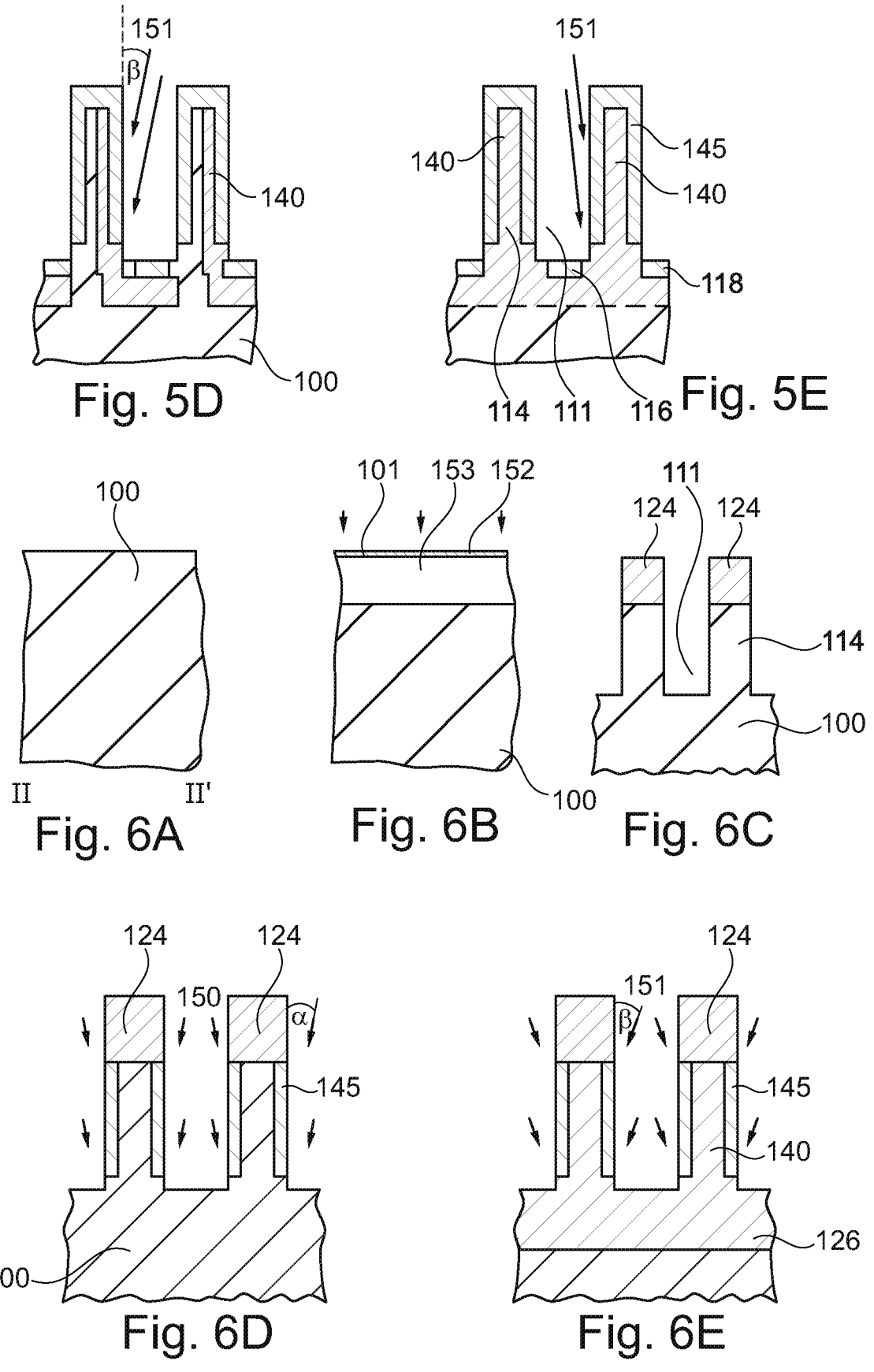

Thereafter, as is shown in FIG. 5D, optionally, doping with dopants of the first conductivity type may be performed. This second doping process 151 may be implemented as a tilted implantation process using an implantation angle β that may be smaller than the first implantation angle α. As a result, the doped portion 140 of the first conductivity type may extend to larger depths than the doped portion 145 of the second conductivity type. The implantation process 151 with dopants of the first conductivity type may be performed at higher energy than the implantation process 150 with the second conductivity type. As a result, the dopants of the first conductivity type penetrate the entire width of the ridge 114.

The implantation energy generally depends from a width of the ridges 114. According to an example, the implantation energy of the first implantation process 150 may be less than 80 keV, e.g. less than 60 keV, e.g. in a range of 20 to 50 keV. Further, the implantation energy of the second implantation process 151 may be larger than 80 keV, e.g. 100 keV or more.

As is illustrated in FIG. 5E, a further implantation process 151 with dopants of the first conductivity type may be performed from the left side.

As a result, the work piece illustrated in FIG. 5E may be obtained. As illustrated, the central portion of the ridges 114 may be doped with dopants of the first conductivity type.

Further, a doping concentration in a lower portion of the ridge 114 near the bottom portion 116 of the gate trench may be lower than in an upper portion of the ridge 114. For example, a lower portion of the ridge may be doped with a first conductivity type only. Further, in the doped portion 145, a concentration of dopants of the second conductivity type decreases from an edge portion of the ridges to a central portion of the ridges 114.

A vertical implantation process at a tilt angle of 0° may be performed with dopants of the second conductivity type to form the shielding portions at the bottom portion 116 of the gate trenches.

Thereafter, further processing steps may be performed for forming further components of the semiconductor device.

FIG. 6A to 6F illustrate a further example of a method of manufacturing a semiconductor device. According to this example, doped portions of the first conductivity type for forming the source regions may be formed before etching the gate trenches.

Starting point may be a silicon carbide substrate 100, which may be lightly doped with the first conductivity type, as is illustrated in FIG. 6A. A doping process may be performed so as to dope a region adjacent to the first main surface 101 of the semiconductor substrate 100 with dopants of the first conductivity type. As a result, a doped portion 153 of the first conductivity type is formed adjacent to the first main surface 101 of the semiconductor substrate, as is also shown in FIG. 6B. Optionally, a stray oxide 152 may be formed over the substrate 100 before performing the doping process. The presence of the stray oxide 152 may result in a more homogenous implantation process and a higher doping concentration at the first main surface 101.

Thereafter, referring to FIG. 6C, gate trenches 111 are formed in the first main surface 101 of the semiconductor substrate. The doped portion of the first conductivity type implements the source regions 124 of the semiconductor device to be formed. Thereafter, a doping process 150 with dopants of the second conductivity type may be performed. In particular, the doping process may be a tilted ion implantation process at an implantation angle α as has been discussed above with reference to FIG. 5B. FIG. 6D shows an example of cross-sectional view of a work piece for illustrating this processing step.

The implantation processes described with reference to FIGS. 6D and 6E may be performed in a similar manner as has been discussed above with reference to FIG. 5B to 5E so that a detailed description thereof and of the parameters of the respective implantation processes is omitted. For example, an energy of the doping process illustrated in FIG. 6D may be in the same range or slightly less than that of the doping process described with reference to FIG. 6B. As a result, undesired doping of the second conductivity type in the top portion of the ridge may be overcompensated by the doping process described with reference to FIG. 6B.

Figures 6F, 7A, 7B, 7C, 7D:
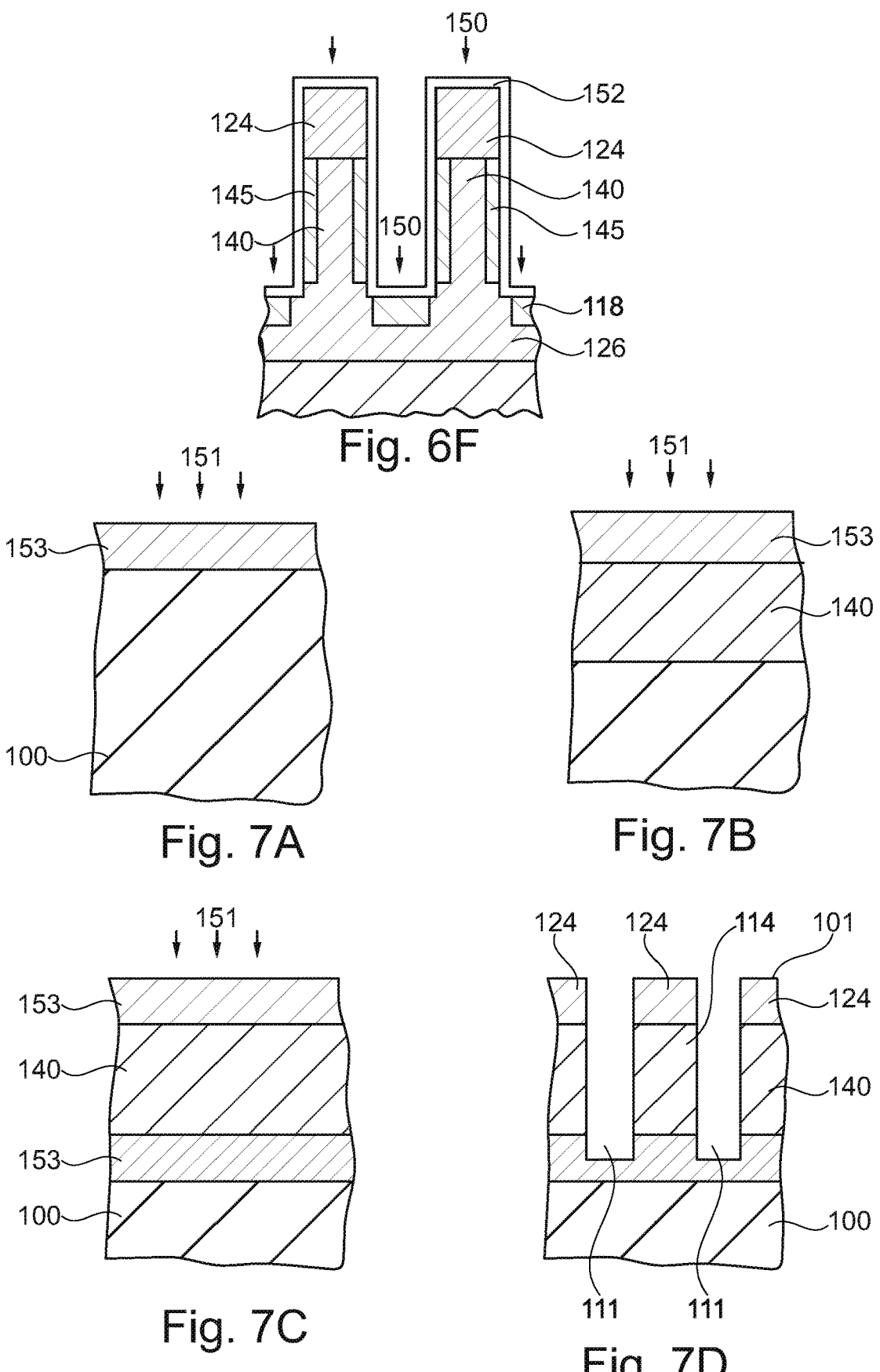

Further, optionally, a second implantation process 151 with dopants of the first conductivity type may be performed as illustrated in FIG. 6E. Further, a vertical implantation process 150 with dopants of the first conductivity type may be performed so as to form the shielding portions 118. For example, a stray oxide 152 may be formed over the ridges 114. The stray oxide 152 may protect the trench side wall against stray particles from this implantation process. For example, the doping process for forming the shielding portions may be performed at comparatively low energies. FIG. 6F shows an example of a resulting structure. Generally, as a result of doping processes employing a comparable low energy, a defect concentration of the device may be reduced. Further, cost may be reduced and a high throughput may be achieved due to large beam intensities.

FIG. 7A to 7F illustrate a further example of the method of manufacturing a semiconductor device. According to this method, before forming the gate trenches dopants of the first conductivity type are implanted to the lower portion of the ridges so as to avoid or reduce a pinch-off effect.

First, referring to FIG. 7A, in a similar manner as has been discussed with reference to FIG. 6B, an ion implantation process 151 with dopants of the first conductivity type is performed to form the doped portion 153 of the first conductivity type.

Optionally, a further ion implantation process 151 may be performed so as to form the doped portion 140 of the first conductivity type. This doped portion 140 will form part of the channel region 122. This ion implantation process 151 may be performed at a higher energy. FIG. 7B shows an example of the resulting structure.

As is illustrated in FIG. 7C a further ion implantation process 151 with dopants of the first conductivity type is performed at a still higher energy to form a further doped portion 153 of the first conductivity type below the portion 140. FIG. 7C shows an example of a resulting structure. This further doped portion 153 of the first conductivity type below the portion 140 may have a higher doping level. For example, a higher doping level may reduce a resistivity in the lower portion of the ridges 124 that will be formed in the next processing step. In more detail, this portion 153 may form a current spreading structure that is arranged below the channel region and may lead the current out of the ridge.

Thereafter, as is illustrated in FIG. 7D, gate trenches 111 are formed in the first main surface 101 of the semiconductor substrate 100. The gate trenches extend in a depth direction to the further doped portion 153.

Figures 7E, 7F:
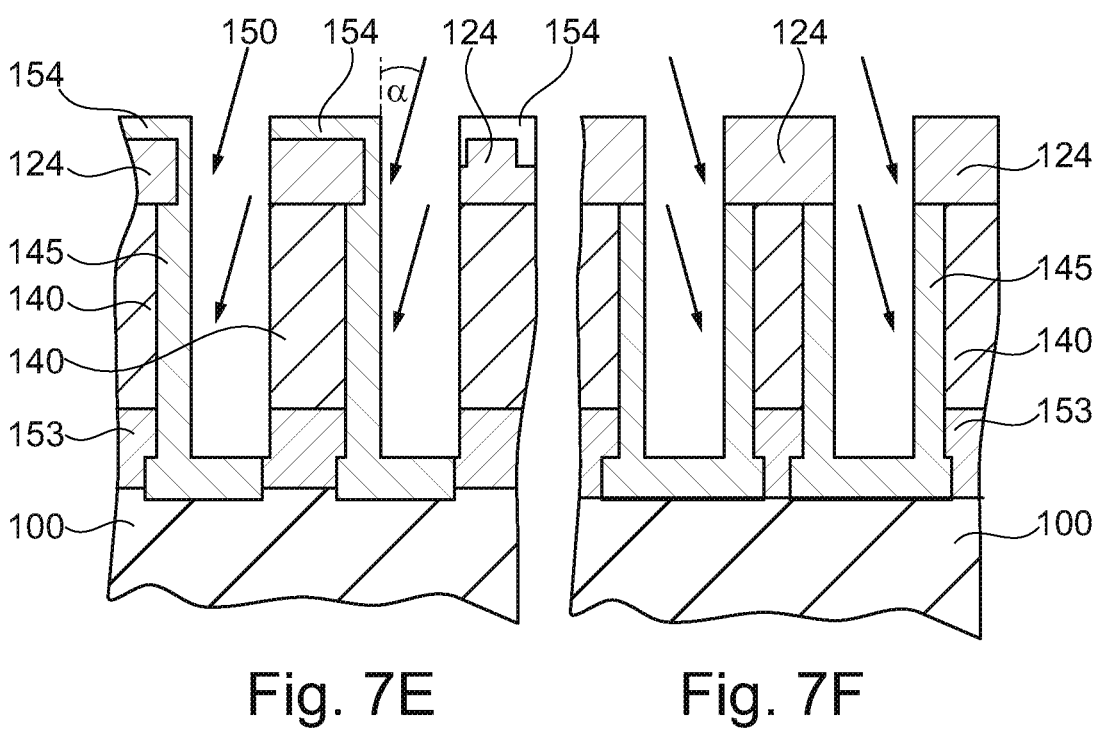

The doped portions of the first conductivity type that have been formed by the process described with reference to FIGS. 7A to 7C implement the source region 124, the doped portion 140 of the first conductivity type and the doped portion 153 of the first conductivity type at the bottom portion of the gate trenches 111. Thereafter, as is illustrated in FIG. 7E, a tilted implantation process 150 with dopants of the second conductivity type is performed from both sides. This doping process may be performed without setting a specific angle of the implantation direction for achieving a shadowing effect of adjacent ridges. Since the doped portion 153 is present in the bottom portion of the ridges 114, a pinch-off effect may be avoided or reduced. For example, a masking layer 154 may be formed over the source regions 124 in order to avoid counter-doping of the source regions 124 due to the implantation process using dopants of the second conductivity type. According to a further example, this process may also be performed without the masking layer 154. In this case, for example, the counter-doped portions of the second conductivity type covering the source regions 124 may be removed after performing the tilted ion implantation process 150.

FIG. 7F shows an example of a resulting structure after performing a second tilted ion implantation process 150 from the left side and removing the masking layer 154 or the counter-doped portions of the source regions 124.

Figure 8:
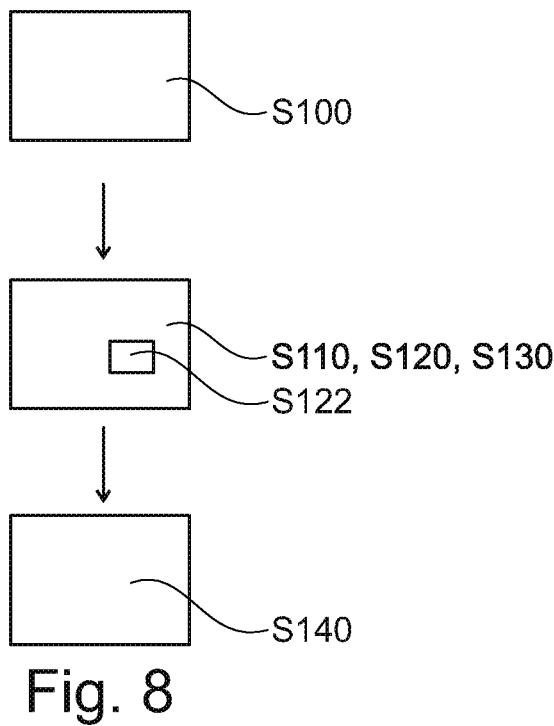
FIG. 8 summarizes a method according to an example.

FIG. 8 summarizes a method according to an example.

A method of manufacturing a semiconductor device comprising a transistor comprises forming (S100) gate trenches in a semiconductor substrate. The gate trenches extend in a first horizontal direction and pattern the semiconductor substrate into ridges, the ridges being arranged between two adjacent gate trenches, respectively. The method further comprises forming (S110) a source region of a first conductivity type, forming (S120) a channel region, and forming (S130) a drift region of the first conductivity type. The source region, the channel region and a part of the drift region are formed in the ridges. Forming (S120) the channel region comprises doping (S122) a portion of the ridges with dopants of a second conductivity type so that a doping concentration of the doped portion decreases in a second horizontal direction intersecting the first horizontal direction from a region close to the gate electrode to a central portion of the ridge. The method further comprises forming (S140) a gate electrode in the gate trenches. The gate electrode is insulated from the channel region and the drift region.

Figures 9A, 9B, 9C:
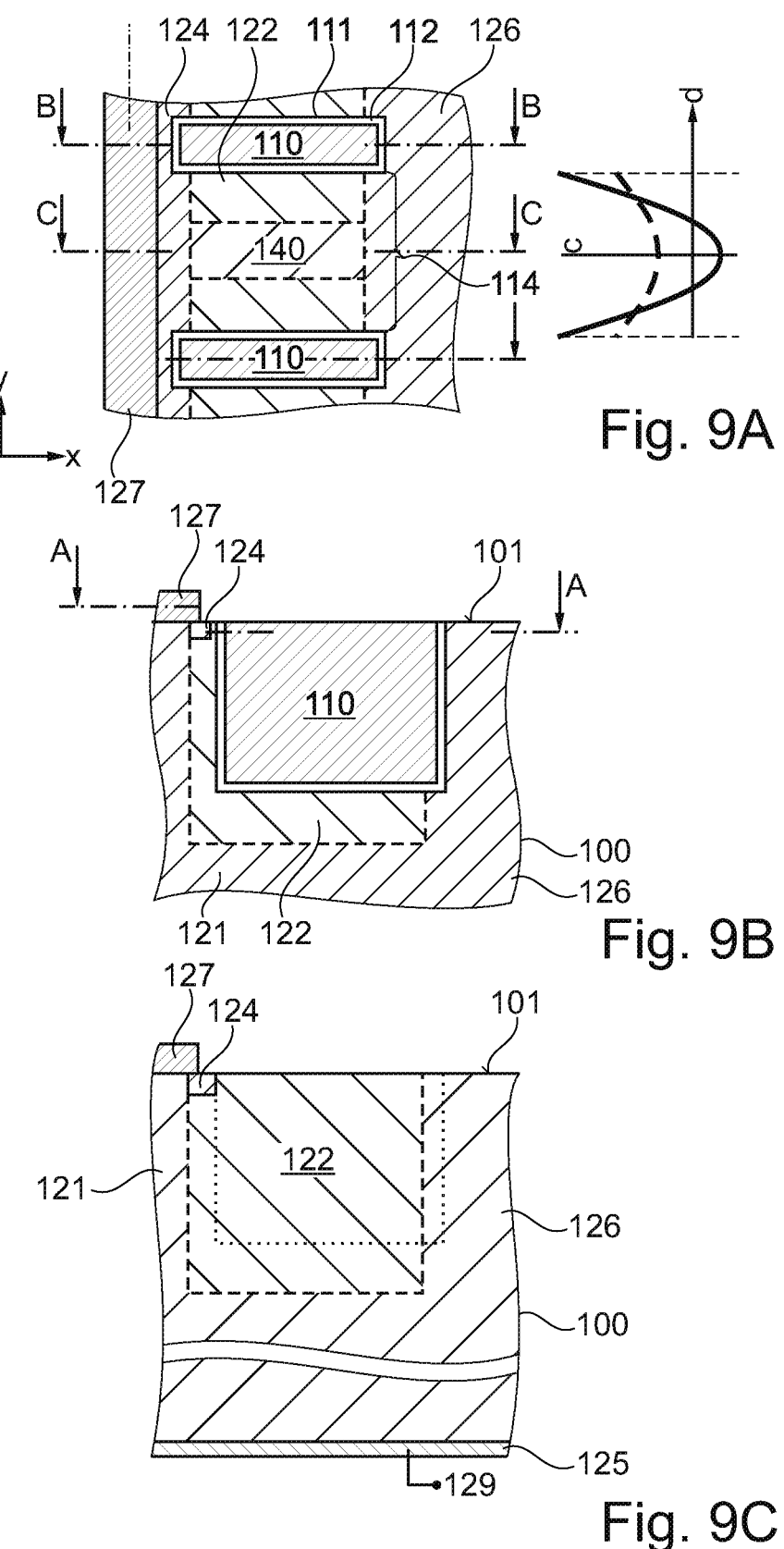
FIGS. 9A to 9C illustrate cross-sectional views of a semiconductor device according to a further example.

FIGS. 9A to 9C illustrate various cross-sectional views of a semiconductor device according to a further example. In particular, as will be discussed in the following, the example illustrated in FIGS. 9A to 9C implements a horizontal or a lateral transistor. FIG. 9A is a horizontal cross-sectional view of the semiconductor device illustrating the positions of the cross-sectional views of FIGS. 9B and 9C. As is shown in FIG. 9A, the gate trenches 111 pattern the semiconductor substrate into ridges. The gate trenches 111 extend in a first direction, e.g. the x direction. A gate electrode 110 is arranged in the gate trenches 111. The gate electrode 110 is insulated from the channel region 122 by means of a gate dielectric 112. The source region 124 may laterally extend in a second horizontal direction, e.g. the y direction. The source region 124 of a first conductivity type may continuously extend in the second direction. According to further examples, the source region 124 may be interrupted. Further, a portion of a source conductive layer 127 may extend in the second direction. A drift region 126 of the first conductivity type is arranged adjacent to a first main surface of the semiconductor substrate. The channel region 122 is arranged between adjacent gate trenches 111. The channel region is arranged in the ridges 114. A doping profile of the channel region is illustrated in the right-hand portion of FIG. 9A. As is shown, a doping concentration of dopants of the second conductivity type decreases along the second horizontal direction from a region close to the gate electrode 111 to a central portion of the ridge 114. According to further examples, a doped portion 140 of the first conductivity type may be arranged in the central portion of the ridge 114.

The cross-sectional view of FIG. 9B is taken in the first direction along a gate trench 111. As is shown, the source region 124 is arranged adjacent to a first main surface 101 of the semiconductor substrate. According to further examples, the source region 124 may extend in a depth direction. A body contact portion 121 is formed to be in contact with the source conductive layer 127. The body contact portion 121 may extend from the first main surface 101 of the semiconductor substrate to a portion below the gate electrode 110 and below the gate trenches 111. The source region 124 is electrically connected to the body contact portion 121. For example, the source conductive layer 127 may be formed so as to overlap the source region 124 and the body contact portion 121.

As is further illustrated in FIG. 9C, the channel region 122 is arranged between the source region 124 and the drift region 126. A drain region 125 may be arranged adjacent to a second main surface 102 of the semiconductor substrate 100. A drain terminal 129 may be electrically connected to the drain region 125.

The channel region 122 may extend to a position below a lower boundary of the gate electrode 110. For example, a portion of the channel region 122 arranged below the lower boundary of the gate electrode 110 may shield a potential applied to the drain terminal 129. Further, different from examples discussed hereinabove, a portion of the drift region 126 is arranged so as to be adjacent to the first main surface 101 of the semiconductor substrate 100.

When a suitable voltage is applied to the gate electrode, a conductive channel is formed in the channel region 122. As a consequence, a current path having a horizontal component is formed between the source region 124, the channel region 122, and the drift region 126. The current path further is formed between the drift region 126 and the drain region 125 and thus has a vertical component. Accordingly, a current path from the source region 124 to the drain region 125 has vertical and horizontal components.

Figures 10A, 10B, 10C:
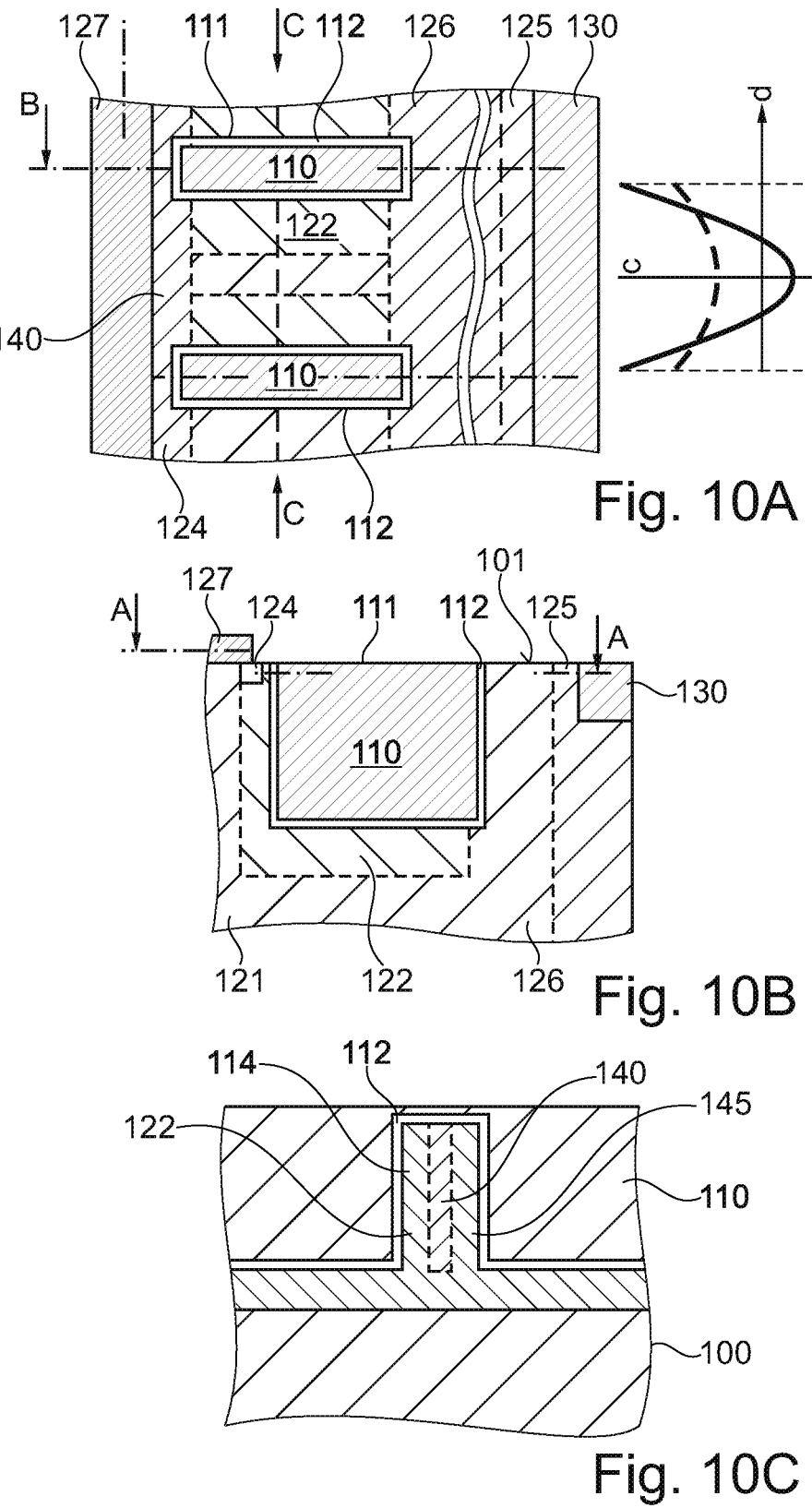
FIGS. 10A to 10C illustrate cross-sectional views of a semiconductor device according to a further example.

FIGS. 10A to 10C illustrate various views of a semiconductor device according to a further example. The example illustrated in FIGS. 10A to 10C implements a horizontal or a lateral transistor in which the source and the drain regions 124, 125 are arranged adjacent to the first main surface 101 of the semiconductor substrate 100. FIGS. 10A to 10C illustrate some components of the semiconductor device. As is clearly to be understood, further elements, in particular shielding portions of the second conductivity type may be present in order to protect the gate dielectric as has been mentioned above.

FIG. 10A is a horizontal cross-sectional view of the semiconductor device illustrating the positions of the cross-sectional views of FIGS. 10B and 10C. As is shown in FIG. 10A, the gate trenches 111 pattern the semiconductor substrate into ridges. The gate trenches 111 extend in a first direction, e.g. the x direction. A gate electrode 110 is arranged in the gate trenches 111. The gate electrode 110 is insulated from the channel region 122 by means of a gate dielectric 112. The source region 124 may laterally extend in a second horizontal direction, e.g. the y direction. The source region 124 of a first conductivity type may continuously extend in the second direction. According to further examples, the source region 124 may be interrupted. Further, a portion of a source conductive layer 127 may extend in the second direction.

A drain region 125 of the first conductivity type may be arranged adjacent to the first main surface 101 of the semiconductor substrate 100. A drain contact 130 may be electrically connected to the drain region 125. The drain contact 130 may continuously extend along the second horizontal direction.

A drift region 126 of the first conductivity type is arranged adjacent to a first main surface of the semiconductor substrate. The channel region 122 is arranged between adjacent gate trenches 111. Further, the channel region 122 is arranged between the source region 124 and the drift region 126.

The channel region is arranged in the ridges 114. A doping profile of the channel region is illustrated in the right-hand portion of FIG. 10A. As is shown, a doping concentration of dopants of the second conductivity type decreases along the second horizontal direction from a region close to the gate electrode 111 to a central portion of the ridge 114. According to further examples, a doped portion 140 of the first conductivity type may be arranged in the central portion of the ridge 114.

The cross-sectional view of FIG. 10B is taken in the first direction along a gate trench 111. As is shown, the source region 124 is arranged adjacent to a first main surface 101 of the semiconductor substrate. According to further examples, the source region 124 may extend in a depth direction. A body contact portion 121 is formed to be in contact with the source conductive layer 127. The body contact portion 121 may extend from the first main surface 101 of the semiconductor substrate to a portion below the gate electrode 110 and below the gate trenches 111. The source region 124 is electrically connected to the body contact portion 121. For example, the source conductive layer 127 may be formed so as to overlap the source region 124 and the body contact portion 121.

When a suitable voltage is applied to the gate electrode, a conductive channel is formed in the channel region 122. As a consequence, a horizontal current path is formed between the source region 124, the channel region 122, and the drift region 126. For example, the current path may exclusively extend in a horizontal direction without a vertical component.

FIG. 10C shows a cross-sectional view of a ridge 114 along the second direction. The gate electrode 110 is adjacent to the sidewalls of the ridge 114. The gate electrode 110 is insulated from the channel region 122 by means of a gate dielectric 112. For example, a doped portion 140 of the first conductivity type may be arranged in the central portion of the ridge 114.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor, the transistor comprising:
   a plurality of gate trenches formed in a semiconductor substrate and extending in a first horizontal direction, the gate trenches patterning the semiconductor substrate into ridges, the ridges being arranged between two adjacent gate trenches, respectively;
   a gate electrode arranged in at least one of the gate trenches;
   a source region of a first conductivity type, a channel region, and a drift region of the first conductivity type, the source region, the channel region and a part of the drift region being arranged in the ridges, the gate electrode being insulated from the channel region and the drift region,
   wherein the channel region comprises a doped portion of a second conductivity type and a doping concentration of the doped portion decreases in a second horizontal direction intersecting the first horizontal direction from a region close to the gate electrode to a central portion of the ridges,
   wherein the channel region further comprises a doped portion of the first conductivity type that vertically extends over an entire depth of the channel region in the central portion of the ridges.

2. The semiconductor device of claim 1, wherein the semiconductor substrate is a silicon carbide substrate.

3. The semiconductor device of claim 1, wherein a width of the ridges is larger than 50 nm.

4. The semiconductor device of claim 1, wherein a current path from the source region to the drift region extends in a depth direction of the semiconductor substrate.

5. The semiconductor device of claim 1, wherein each of the ridges comprises first portions and second portions alternatingly arranged along the first horizontal direction, wherein the channel region is arranged in the first portions, wherein a body contact portion for electrically contacting the channel region is arranged in the second portions, and wherein a source conductive layer is electrically connected to the body contact portion.

6. The semiconductor device of claim 5, wherein a doping concentration in at least one of the second portions of the ridges is larger than a doping concentration in at least one of the first portions of the ridges.

7. The semiconductor device of claim 5, wherein a doping profile along the second horizontal direction in at least one of the first portions of the ridges is identical with a doping profile along the second horizontal direction in at least one of the second portions of the ridges.

8. The semiconductor device of claim 1, further comprising shielding portions of the second conductivity type arranged below the gate trenches.

9. The semiconductor device of claim 8, wherein the shielding portions are electrically connected to a neighboring doped portion of the second conductivity type of the channel region.

10. The semiconductor device of claim 1, wherein the gate electrode extends along the ridges, and wherein the channel region is in electrical contact with a source conductive layer via a contact region extending between portions of the gate electrode assigned to neighboring ridges, respectively.

11. The semiconductor device of claim 1, wherein the source region is arranged at a first main surface of the semiconductor substrate, the semiconductor device further comprising:

a drain region at a second main surface of the semiconductor substrate opposite the first main surface, wherein a current path from the source region to the drain region has a horizontal component.

12. The semiconductor device of claim 1, wherein the source region is arranged at a first main surface of the semiconductor substrate, the semiconductor device further comprising:

a drain region at the first main surface of the semiconductor substrate, wherein a current path from the source region to the drain region extends in a horizontal direction.

13. A semiconductor device comprising a transistor, the transistor comprising:

a plurality of gate trenches formed in a semiconductor substrate and extending in a first horizontal direction, the gate trenches patterning the semiconductor substrate into ridges, the ridges being arranged between two adjacent gate trenches, respectively;

a gate electrode arranged in at least one of the gate trenches;

a source region of a first conductivity type, a channel region, and a drift region of the first conductivity type, the source region, the channel region and a part of the drift region being arranged in the ridges, the gate electrode being insulated from the channel region and the drift region, wherein the channel region comprises a doped portion of a second conductivity type and a doping concentration of the doped portion decreases in a second horizontal direction intersecting the first horizontal direction from a region close to the gate electrode to a central portion of the ridges, wherein each of the ridges comprises first portions and second portions alternatingly arranged along the first horizontal direction, wherein the channel region is arranged in the first portions, wherein a body contact portion for electrically contacting the channel region is arranged in the second portions, wherein a source conductive layer is electrically connected to the body contact portion, wherein a doping profile along the second horizontal direction in at least one of the first portions of the ridges is identical with a doping profile along the second horizontal direction in at least one of the second portions of the ridges.

* * * * *